(12) United States Patent
Yang

(10) Patent No.: US 6,852,595 B2
(45) Date of Patent: Feb. 8, 2005

(54) METHOD OF MANUFACTURING A FLASH MEMORY CELL

(75) Inventor: In Kwon Yang, Kyungki-Do (KR)

(73) Assignee: Hynix Semiconductor, Kyungki-do (KR)

(*) Notice: Subject to any disclaimer, the term of this patent is extended or adjusted under 35 U.S.C. 154(b) by 73 days.

(21) Appl. No.: 10/310,387

(22) Filed: Dec. 5, 2002

(65) Prior Publication Data

US 2003/0134472 A1 Jul. 17, 2003

(30) Foreign Application Priority Data

Dec. 22, 2001 (KR) ........................................ 2001-83499

(51) Int. Cl.⁷ ............................................. H01L 21/336
(52) U.S. Cl. ...................... 438/257; 438/696; 438/784; 438/738
(58) Field of Search ................................ 438/257, 696, 438/784, 738

(56) References Cited

U.S. PATENT DOCUMENTS

| | | | |
|---|---|---|---|
| 4,775,642 A | * 10/1988 | Chang et al. | 438/258 |
| 5,644,153 A | 7/1997 | Keller | 257/324 |
| 5,856,239 A | 1/1999 | Bashir et al. | 438/738 |
| 5,928,966 A | * 7/1999 | Yamane | 438/725 |
| 5,981,339 A | * 11/1999 | Chang et al. | 438/257 |
| 6,040,248 A | 3/2000 | Chen et al. | 438/725 |
| 6,103,596 A | 8/2000 | Peng | 438/439 |
| 6,159,860 A | 12/2000 | Yang et al. | 438/706 |
| 6,200,902 B1 | * 3/2001 | Mitsuiki | 438/700 |
| 6,265,294 B1 | 7/2001 | Park et al. | 438/533 |

FOREIGN PATENT DOCUMENTS

| | | |
|---|---|---|
| EP | 0167136 | 1/1986 |
| JP | 03050824 | 3/1991 |
| JP | 9-330987 | 12/1997 |
| KR | 1998-080876 | 11/1998 |

OTHER PUBLICATIONS

Office Action from Korean Intellectual Property Office dated Nov. 26, 2003 (2 pages).
International Search Report of the German Patent Office dated Apr. 8, 2003 (3 pages).

* cited by examiner

*Primary Examiner*—Amir Zarabian
*Assistant Examiner*—Jeff Vockrodt
(74) *Attorney, Agent, or Firm*—Marshall, Gerstein & Borun, LLP

(57) ABSTRACT

Methods of manufacturing flash memory cells. During a cleaning process after an etching process for forming a control gate is performed, polymer remains at the sidewall of a tungsten silicide layer. Therefore, the sidewall of the tungsten silicide layer is protected from a subsequent a self-aligned etching process. In addition, upon a self-aligned etching process, the etch selective ratio of the tungsten silicide layer to a polysilicon layer is sufficiently obtained using a mixed gas of $HBr/O_2$. Therefore, etching damage to the sidewall of the tungsten silicide layer can be prevented. As a result, reliability of the process and an electrical characteristic of the resulting device are improved.

28 Claims, 12 Drawing Sheets

METHOD OF MANUFACTURING A FLASH MEMORY CELL

BACKGROUND

1. Technical Field

Methods of manufacturing flash memory cells are disclosed, and more particularly methods of manufacturing flash memory cells that prevent generation of etching damage at the sidewall of a stack gate when an etching process for forming a control gate and a floating gate is performed.

2. Description of the Related Art

Generally, a flash memory cell has a structure in which a tunnel oxide film, a floating gate consisting of a first polysilicon layer, a dielectric film, a control gate made of a second polysilicon layer, and a tungsten silicide layer are stacked. At this time, source and drain are formed at both sides of the tunnel oxide film.

The flash memory cell constructed above is formed by first patterning the tungsten silicide layer, the second polysilicon layer and the dielectric film by means of an etching process and then patterning the first polysilicon layer and the tunnel oxide film by means of a self-aligned etch (SAE) process.

At this time, during the process of patterning the first polysilicon layer and the tunnel oxide film using the self-aligned etch (SAE) process, etching damage is generated at the sidewall of the tungsten silicide layer due to an etch profile of the dielectric film, the second polysilicon layer and the tungsten silicide layer, being an upper layer, and $Cl_2$ being an etch gas.

A conventional method of manufacturing a flash memory cell will be below described by reference to the drawings.

FIG. 1 is a layout diagram of a conventional flash memory cell, FIG. 2A through FIG. 2D are cross-sectional views of the flash memory cell for explaining a method of manufacturing the flash memory cell with the layout in FIG. 1 taken along lines X–X', and FIG. 3A through FIG. 3E are cross-sectional views of the flash memory cell for explaining a method of manufacturing the flash memory cell with the layout in FIG. 1 taken along lines Y–Y'.

Referring now to FIG. 1, FIG. 2A and FIG. 3A, a device isolation film 12 is formed at a device isolation region of a semiconductor substrate 11. A tunnel oxide film 13 is then formed on the surface of the semiconductor substrate 11 in which the device isolation film 12 is not formed. Next, a first polysilicon layer 14 for forming a floating gate is formed on the entire surfaces.

By reference to FIG. 1 and FIG. 2B, the first polysilicon layer 14 on the device isolation film 12 is removed by an etching process. Thus, the first polysilicon layer 14 is isolated electrically.

Referring now to FIG. 1, FIG. 2C and FIG. 3B, a dielectric film 15, a second polysilicon layer 16 for a control gate, a tungsten silicide layer 17 and an anti-reflection film 18 are sequentially formed on the entire surfaces.

At this time, the tungsten silicide layer 17 is formed in order to reduce the contact resistance of the control gate. The anti-reflection film 18 made of a nitride material is formed in order to improve a patterning characteristic in a subsequent etching process.

Next, a control gate mask pattern 19 made of a photoresist or a hard mask is formed on the anti-reflection film 18.

Referring now to FIG. 1 and FIG. 3C, the anti-reflection film 18, the tungsten silicide layer 17, the second polysilicon layer 16 and the dielectric film 15, at the regions that are exposed by the control gate mask pattern 19, are removed by the etching process. Therefore, a control gate consisting of the second polysilicon layer 16 and the tungsten silicide layer 17 is formed. The first polysilicon layer 14 is also exposed at the region for which the etching process is performed.

After the control gate is formed by the etching process, a cleaning process is performed using BOE ranging from 300:1 through 100:1 in order to remove a particle of oxide series and polymer which are generated when the dry etching process for the control gate is performed.

Referring now to FIG. 1, FIG. 2D and FIG. 3D, the first polysilicon layer 14 and the tunnel oxide film 13 are patterned by the self-aligned etching process. The control gate mask pattern is then removed. Therefore, a floating gate consisting of the first polysilicon layer 14 is formed.

At this time, the self-aligned etching process for forming the floating gate includes performing a dry etching process using a gas mixture of $Cl_2/O_2$. In case that the gas mixture of $Cl_2/O_2$ is used, the etch selective ratio of the polysilicon layer to the tungsten silicide layer is 1.2:1 through 1.5:1. Therefore, the dry etching process is performed in a state that the etch selective ratio of the polysilicon layer to the tungsten silicide layer is not sufficiently obtained. Further, as the dry etching process is performed in a state that polymer or particle is removed and the sidewall of the tungsten silicide layer 17 is exposed by the cleaning process, etching damage 100 is generated at the sidewall of the tungsten silicide layer 17 depending on an atmosphere of an etch chamber or an etch condition.

Referring now to FIG. 1 and FIG. 3E, a source and a drain 20a and 20b are formed at both sides of the first polysilicon layer 14 by means of an ion implantation process. The ion implantation process includes performing a self-aligned ion implantation process using the nitride film 18 as an ion implantation mask.

At this time, all the sources 20a in a cell that share the control gate are connected by implanting an impurity into even a region from which the device isolation film 12 is removed after removing a given region of the device isolation film 12. Thereby, the source 20a is formed to have a shape of a common source line.

With the above processes, a flash memory cell consisting of the floating gate, the control gate, the source and the drain is manufactured.

As described above, in a process of manufacturing the flash memory cell, the dry etching process and cleaning process are performed twice in order to form the control gate and the floating gate. At this time, etching damage is generated at the sidewall of the tungsten silicide layer that is exposed during the dry etching process for forming the floating gate. Due to this, the sheet resistance Rs of the control gate is increased and an electrical characteristic of a device is thus degraded.

FIG. 4A and FIG. 4B show cross-sectional SEM photographs illustrating a state that etching damage is generated at the sidewall of a tungsten silicide layer. In particular, FIG. 4A shows a cross-sectional SEM photography when the control gate mask pattern is formed using the photoresist and FIG. 4B shows a cross-sectional SEM photography when the control gate mask pattern is formed using the hard mask.

Referring now to FIG. 4A and FIG. 4B, after polymer or a particle is removed, the self-aligned etching process for forming the floating gate is performed with the sidewall of the tungsten silicide layer being exposed. Thus, it could be seen that etching damage is generated at the sidewall of the tungsten silicide layer regardless of a material forming the control gate mask pattern. This etching damage is not always generated but generated depending on an atmosphere of an etch chamber or an etch condition.

Therefore, there are problems that not only reliability of the process is degraded but also the electrical characteristic of a device is degraded.

SUMMARY OF THE DISCLOSURE

Methods of manufacturing a flash memory cell are disclosed that are capable of preventing generation of etching damage at the sidewall of a tungsten silicide layer and thus improving reliability of a process and an electrical characteristic of a device, in such a way that when a cleaning process is performed after forming a control gate by an etching process, polymer remains at the sidewall of the tungsten silicide layer in order to protect the sidewall of the tungsten silicide layer, and the etch selective ratio of the tungsten silicide layer to a polysilicon layer is sufficiently obtained using a mixed gas of $HBr/O_2$ upon a self-aligned etching process.

A disclosed method of manufacturing a flash memory cell according to a first embodiment comprises forming a tunnel oxide film and a first polysilicon layer to have a given pattern, sequentially forming a dielectric film, a second polysilicon layer, a tungsten silicide layer and an anti-reflection film on the entire surfaces, forming a control gate consisting of the tungsten silicide layer and the second polysilicon layer by means of a patterning process, and forming a floating gate consisting of the first polysilicon layer through a self-aligned etching process, the method being characterized in that after the patterning process is performed, a particle of an oxide series is removed while remaining polymer through a cleaning process to form a polymer film at the side wall of the anti-reflection film, the tungsten silicide layer, the second polysilicon layer and the dielectric film, thereby protecting the side wall of the tungsten silicide layer from etching damage upon the self-aligned etching process.

A disclosed method of manufacturing a flash memory cell according to a second embodiment comprises forming a tunnel oxide film and a first polysilicon layer to have a given pattern, sequentially forming a dielectric film, a second polysilicon layer, a tungsten silicide layer and an anti-reflection film on the entire surfaces, forming a control gate consisting of the tungsten silicide layer and the second polysilicon layer by means of a patterning process, and forming a floating gate consisting of the first polysilicon layer through a self-aligned etching process, the method being characterized in that upon the self-aligned etching process, the etch selective ratio of the first polysilicon layer to the tungsten silicide layer is obtained using a mixed gas of $HBr/O_2$, thereby protecting the side wall of the tungsten silicide layer from etching damage.

A disclosed method of manufacturing a flash memory cell according to a third embodiment comprises preparing a semiconductor substrate in which a tunnel oxide film and a first polysilicon layer are formed to have a given pattern, and in which a dielectric film, a second polysilicon layer, a tungsten silicide layer and an anti-reflection film are sequentially formed on the entire surfaces; patterning the anti-reflection film, the tungsten silicide layer, the second polysilicon layer and the dielectric film to form a control gate consisting of the tungsten silicide layer and the second polysilicon layer; removing particles of an oxide series and having polymer remained, through a cleaning process, to form a polymer film at the sidewall of the anti-reflection film, the tungsten silicide layer, the second polysilicon layer and the dielectric film; etching the first polysilicon layer and the tunnel oxide film by means of the self-aligned etching process to form a floating gate consisting of the first polysilicon layer; and forming source and drain at both sides of the tunnel oxide film.

A disclosed method of manufacturing a flash memory cell according to a fourth embodiment comprises preparing a semiconductor substrate in which a tunnel oxide film and a first polysilicon layer are formed to have a given pattern are formed, and in which a dielectric film, a second polysilicon layer, a tungsten silicide layer and an anti-reflection film are sequentially formed on the entire surfaces; patterning the anti-reflection film, the tungsten silicide layer, the second polysilicon layer and the dielectric film to form a control gate consisting of the tungsten silicide layer and the second polysilicon layer; etching the first polysilicon layer and the tunnel oxide film by means of a self-aligned etching process using a mixed gas of $HBr/O_2$ to form a floating gate consisting of the first polysilicon layer; and forming source and drain at both sides of the tunnel oxide film.

A disclosed method of manufacturing a flash memory cell according to a fifth embodiment comprises preparing a semiconductor substrate in which a tunnel oxide film and a first polysilicon layer are formed to have a given pattern are formed, and in which a dielectric film, a second polysilicon layer, a tungsten silicide layer and an anti-reflection film are sequentially formed on the entire surfaces; patterning the anti-reflection film, the tungsten silicide layer, the second polysilicon layer and the dielectric film to form a control gate consisting of the tungsten silicide layer and the second polysilicon layer; removing particles of an oxide series and having polymer remained, through a cleaning process, to form a polymer film at the sidewall of the anti-reflection film, the tungsten silicide layer, the second polysilicon layer and the dielectric film; etching the first polysilicon layer and the tunnel oxide film by means of a self-aligned etching process using a mixed gas of $HBr/O_2$ to form a floating gate consisting of the first polysilicon layer; and forming source and drain at both sides of the tunnel oxide film.

As described above, the disclosed methods prevent generation of etching damage at the sidewall of a tungsten silicide layer, by controlling a process condition of a cleaning process, controlling a process condition of a self-aligned etching process for forming a floating gate or simultaneously controlling both the above process conditions, after a control gate is formed by an etching process.

BRIEF DESCRIPTION OF THE DRAWINGS

The disclosed methods will be explained in the following description, in conjunction with the accompanying drawings, wherein.

DETAILED DESCRIPTION OF THE PRESENTLY PREFERRED EMBODIMENTS

The disclosed methods of manufacturing a flash memory cell will be described in detail by reference to the accompanying drawings.

Figure 5:
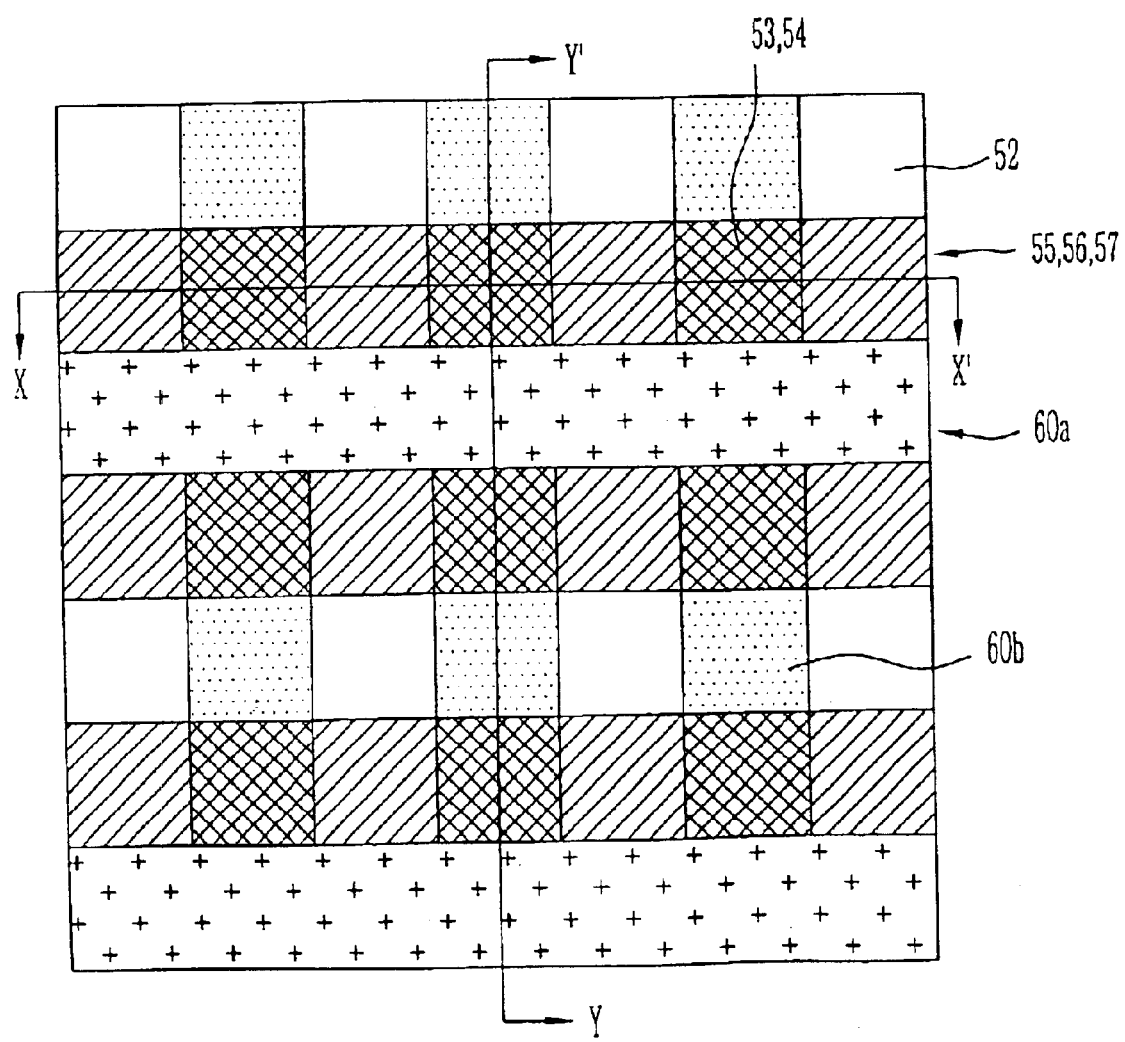
FIG. 5 is a layout diagram of a flash memory cell according to the present invention.

FIG. 5 is a layout diagram of a flash memory cell according to the present invention, FIG. 6A through FIG. 6D are cross-sectional views of the flash memory cell for explaining a method of manufacturing the flash memory cell with the layout in FIG. 5 taken along lines X–X', and FIG. 7A through FIG. 7F are cross-sectional views of the flash memory cell for explaining a method of manufacturing the flash memory cell with the layout in FIG. 5 taken along lines Y–Y'.

Figure 6A:
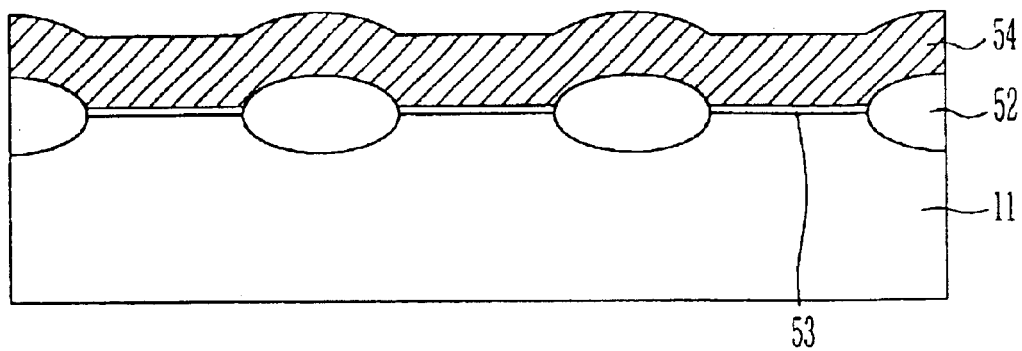
FIG. 6A through FIG. 6D are cross-sectional views of the flash memory cell for explaining a method of manufacturing the flash memory cell with the layout in FIG. 5 taken along lines X–X'.
Figure 7A:
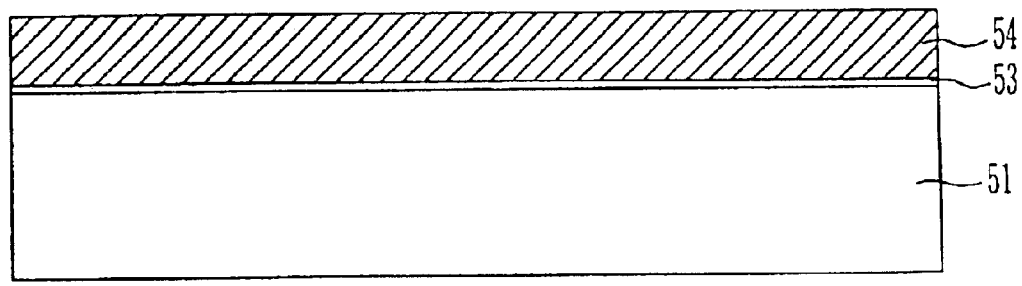
FIG. 7A through FIG. 7F are cross-sectional views of the flash memory cell for explaining a method of manufacturing the flash memory cell with the layout in FIG. 5 taken along lines Y–Y'.

Referring now to FIG. 5, FIG. 6A and FIG. 7A, a device isolation film 52 is formed at a device isolation region of a semiconductor substrate 51. A tunnel oxide film 53 is then formed on the surface of the semiconductor substrate 51 in which the device isolation film 52 is not formed. Next, a first polysilicon layer 54 for forming a floating gate is formed on the entire surface.

Figure 6B:
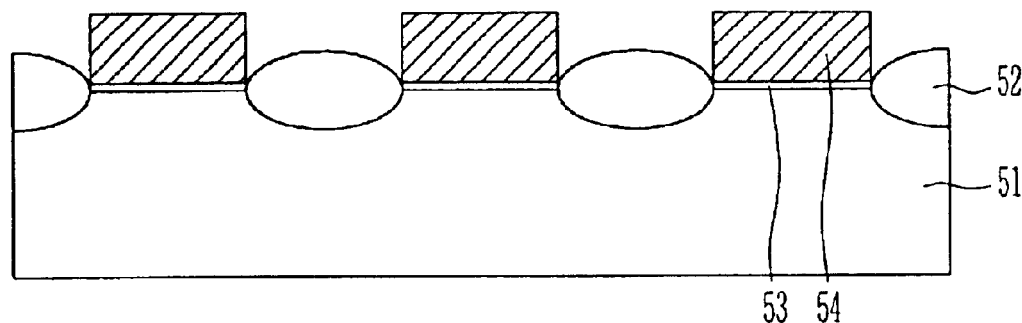

Referring to FIG. 5 and FIG. 6B, the first polysilicon layer 54 on the device isolation film 52 is removed by an etching process. Thus, the first polysilicon layer 54 is electrically separated.

Figure 6C:
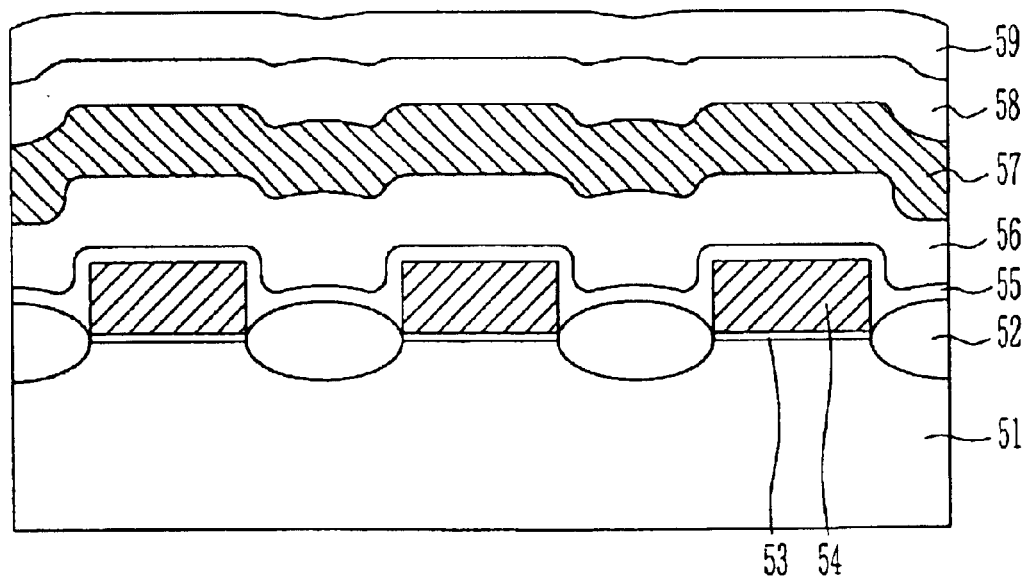
Figure 7B:
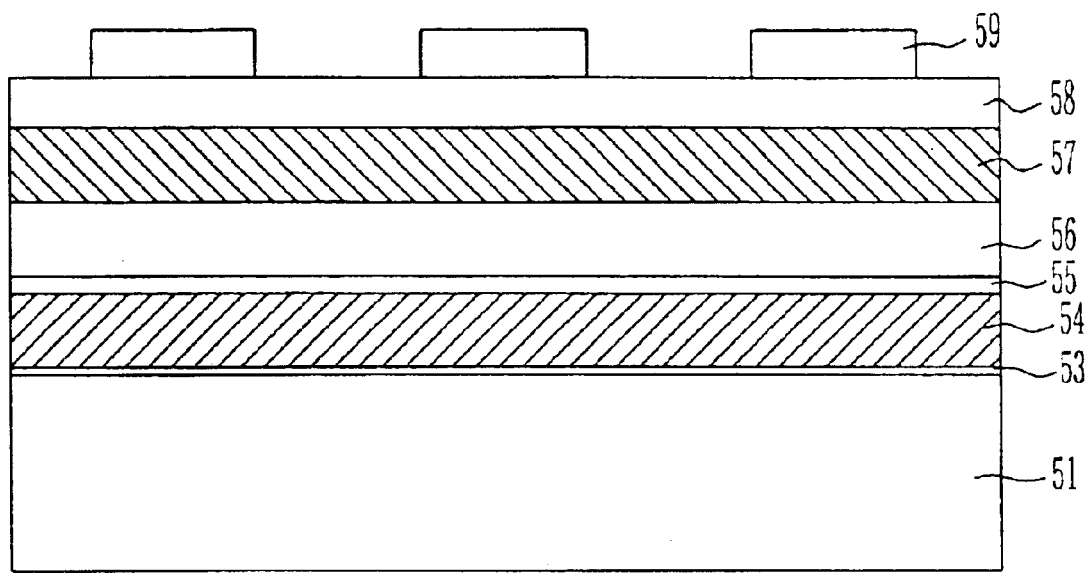

By reference to FIG. 5, FIG. 6C and FIG. 7B, a dielectric film 55, a second polysilicon layer 56 for a control gate, a tungsten silicide layer 57 and an anti-reflection film 58 are sequentially formed on the entire surfaces.

At this time, the tungsten silicide layer 57 is formed in order to reduce the contact resistance of the control gate. The anti-reflection film 58 made of a nitride material is formed in order to improve a patterning characteristic in a subsequent etching process.

Next, a control gate mask pattern 59 made of a photoresist or a hard mask is formed on the anti-reflection film 58.

Figure 7C:
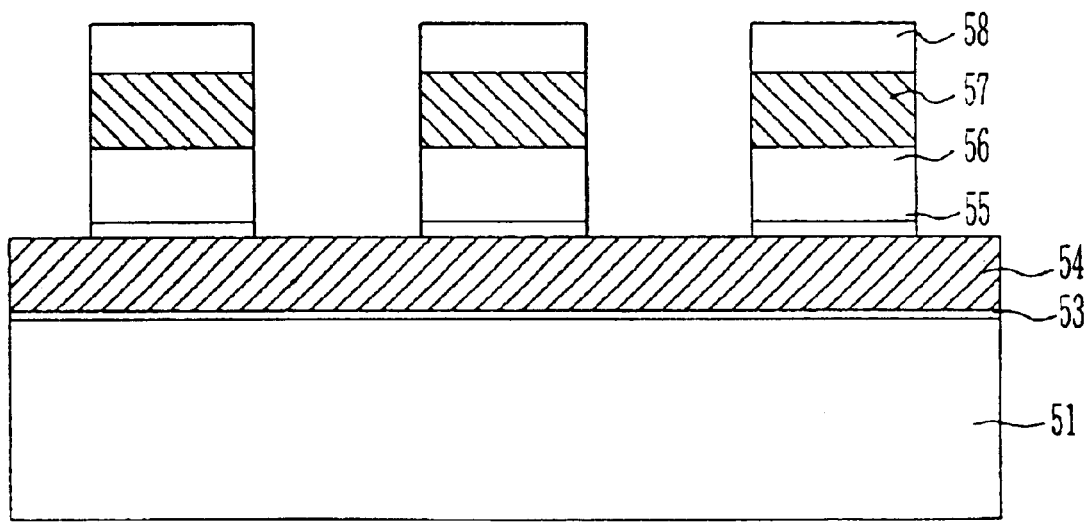

Referring now to FIG. 5 and FIG. 7C, the anti-reflection film 58, the tungsten silicide layer 57, the second polysilicon layer 56 and the dielectric film 55, at regions that are exposed by the control gate mask pattern 59, are removed by the etching process. Therefore, a control gate consisting of the second polysilicon layer 56 and the tungsten silicide layer 57 is formed. The first polysilicon layer 54 is also exposed at the region for which the etching process is performed.

At this time, the etching process may be performed in an etch equipment of a RIE (Reactive Ion Etching) type or an etch equipment of a MERIE (Magnetically Enhanced Reactive Ion Etching) type.

Figure 7D:
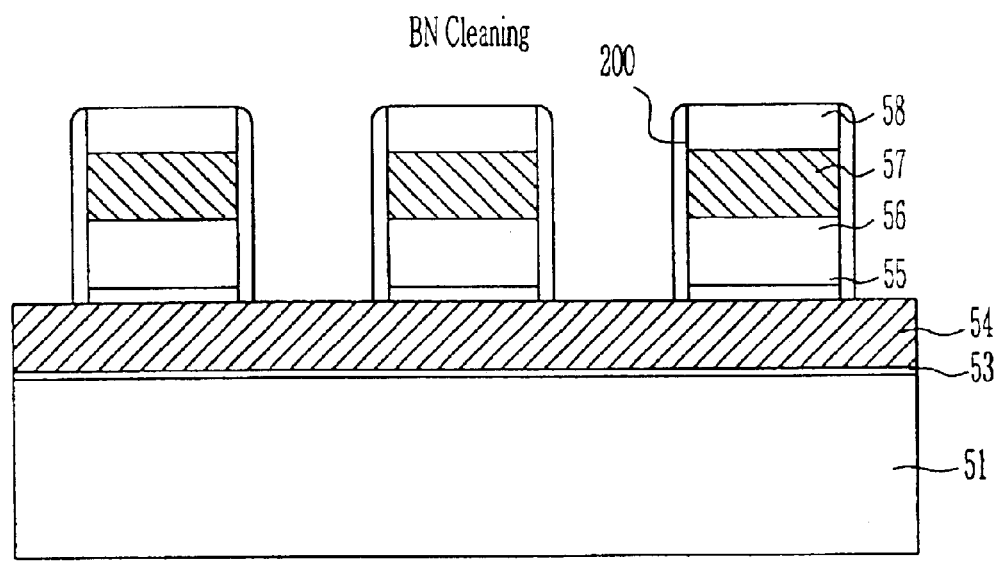

Referring to FIG. 5 and FIG. 7D, after the control gate is formed by the etching process, a cleaning process is performed in order to remove particles of an oxide series that is generated upon a dry etching process for the control gate.

The cleaning process may be performed in a cleaning equipment of a multi-bath type with a B cleaning (CLN B) process or a BN cleaning (CLN BN) process which is simultaneously performed with the B cleaning and a N cleaning (CLN N). The B cleaning process is also called a Piraha cleaning, SPM or a D cleaning (CLN D) process. The B cleaning process is performed in order to remove a heavy organic impurity. Further, the B cleaning process is performed using a solution in which $H_2SO_4$ and $H_2O_2$ are mixed at a ratio ranging from about 3:1 to about 4:1 at a temperature ranging from about 100 to about 130° C. Main reactions include a dehydrogenation reaction and an oxidization reaction. Meanwhile, the N cleaning process is also called SC (standard cleaning)-1 or AMP cleaning process. The N cleaning process is performed in order to remove a light organic impurity such as a particle. Further, the N cleaning process is performed using a solution in which $NH_4OH$, $H_2O_2$ and $H_2O$ are mixed at a ratio ranging from about 1:1:5 to about 1:4:20.

Further, in order to improve the cleaning characteristic, the cleaning process may be performed using a mega sonic-on process by which particles are easily removed by applying a high frequency of about 10 MHz to a cleaning bath containing a cleaning solution in a cleaning equipment of a multi-bath type, or a rocking process by which particles are easily removed by shaking the cleaning bath.

In the above, as the cleaning process employs the BN process, polymer 200 remains at the sidewall of the anti-reflection film 58, the tungsten silicide layer 57, the second polysilicon layer 56 and the dielectric film 55, while particles are removed. Thereby, the sidewall of the anti-reflection film 58, the tungsten silicide layer 57, the second polysilicon layer 56 and the dielectric film 55 is not exposed by the polymer 200.

At this time, if the above process is applied to a gain process in which a conductive final inspection critical dimension (FICD) is increased by an amount ranging from about 15 to about 25% than a photoresist developed inspection critical dimension (DICD), the sidewall of the tungsten silicide layer 57 can be further protected using the polymer 200 kept remained by the cleaning process. In the above, DICD represents critical dimension (CD) that is measured after the photoresist film is formed, and FICD represents CD that is measured after a dry etching process and a post-process process are performed.

Figure 6D:
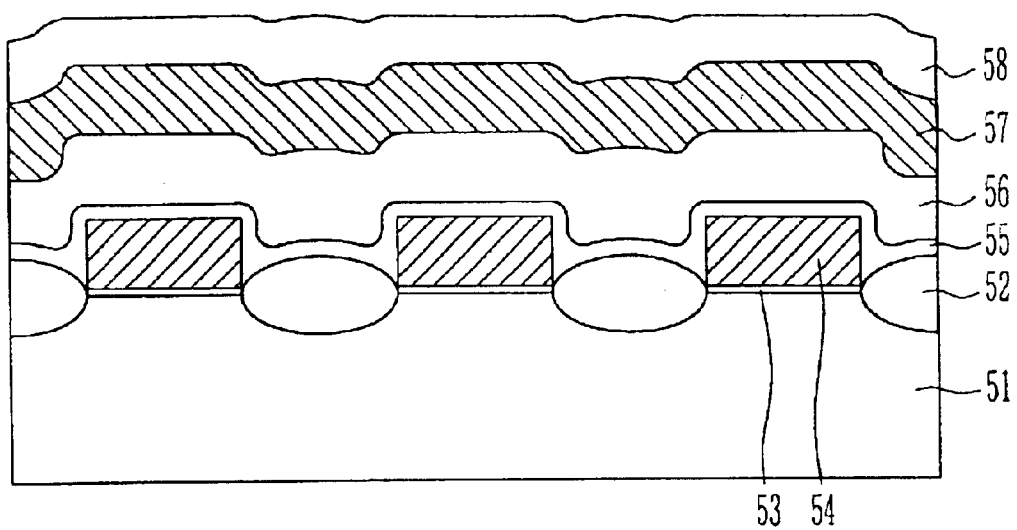
Figure 7E:
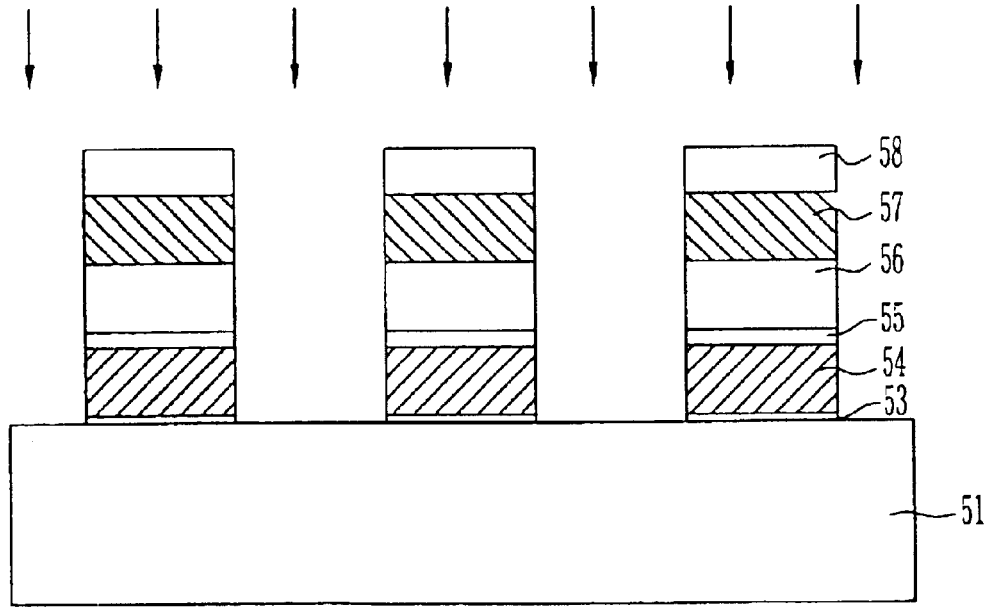

Referring now to FIG. 5, FIG. 6D and FIG. 7E, the first polysilicon layer 54 and the tunnel oxide film 53 are patterned by the self-aligned etching process. The control gate mask pattern 59 is then removed.

At this time, the self-aligned etching process for forming the floating gate includes performing a dry etching process using a gas in which $HBr/O_2$ are mixed at a ratio ranging from about 50:1 to about 100:1 by applying a bias power ranging from about 100 to about 5000 W. At this time, for the purpose of plasma stabilization, He gas of 50 through 200 sccm is supplied as an additive gas. Thereby, in case that the mixed gas of $HBr/O_2$ is used upon the self-aligned etching process, the etch selective ratio of the polysilicon layer to the tungsten silicide layer ranges from about 100:1 to about 300:1. As above, as the etch selective ratio of the polysilicon layer to the tungsten silicide layer is sufficiently obtained, etching damage to the sidewall of the tungsten silicide layer 57 upon the self-aligned etching process can be prevented by maximum.

Also, as the dry etching process is performed with the particle removed by the cleaning process and the polymer 200 remained at the sidewall of the anti-reflection film 58, the tungsten silicide layer 57, the second polysilicon layer 56 and the dielectric film 55, the sidewall of the tungsten silicide layer 57 is protected by the polymer 200. Therefore, generation of etching damage can be prevented.

After the self-aligned etching process for the first polysilicon layer 54 is finished, the polymer is removed. Thereby, the floating gate consisting of the first polysilicon layer 54 is formed.

The etching process and self-aligned etching process, which are explained by reference to FIG. 7C and FIG. 7E, are performed in a chamber using a waferless auto plasma cleaning (WAC) process. The WAC process serves to improve a periodic maintenance (PM) cycle of the chamber by removing polymer deposited within the chamber of the dry etch equipment at a dry etch condition. At this time, PM means that the inside of the chamber is cleaned by a wet etching process in order to remove polymer deposited within the chamber of the dry etch equipment.

Figure 7F:
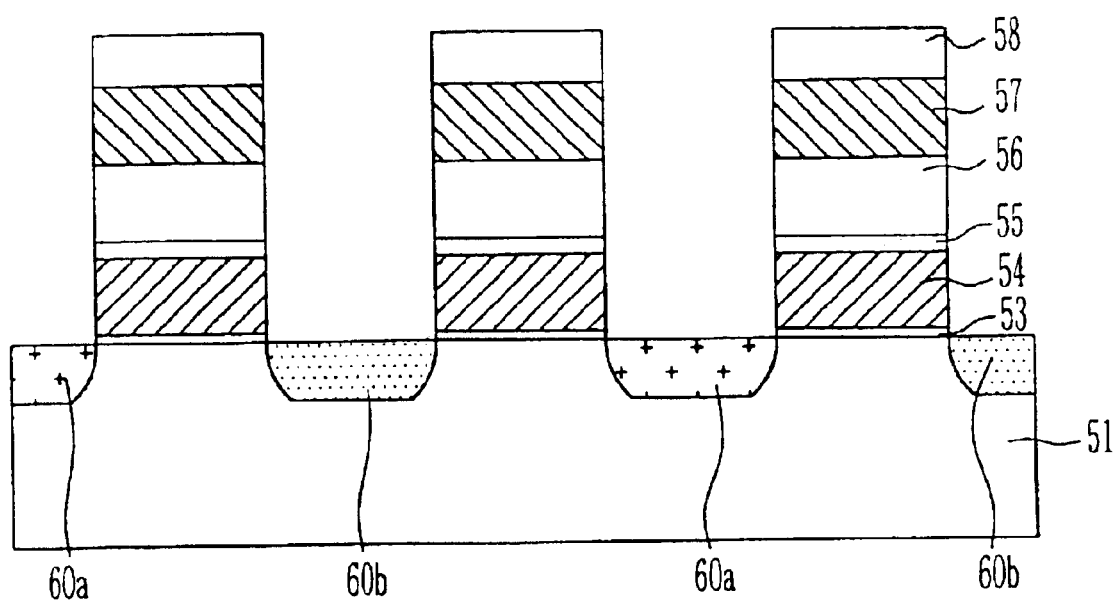

Referring now to FIG. 5 and FIG. 7F, a source 60a and a drain 60b are formed at both sides of the first polysilicon layer 54 by means of the ion implantation process. The ion implantation process includes performing a self-aligned ion implantation process using the nitride film 58 as an ion implantation mask.

At this time, a given region of the device isolation film 52 is removed. An impurity is then implanted even into a region from which the device isolation film 52 is removed. Thereby, all the sources 60a in a cell sharing the control gate are connected. The source 60a is thus formed to have a shape of a common source line.

With the above process, a flash memory cell consisting of the floating gate, the control gate, the source and the drain is manufactured.

Figure 1:
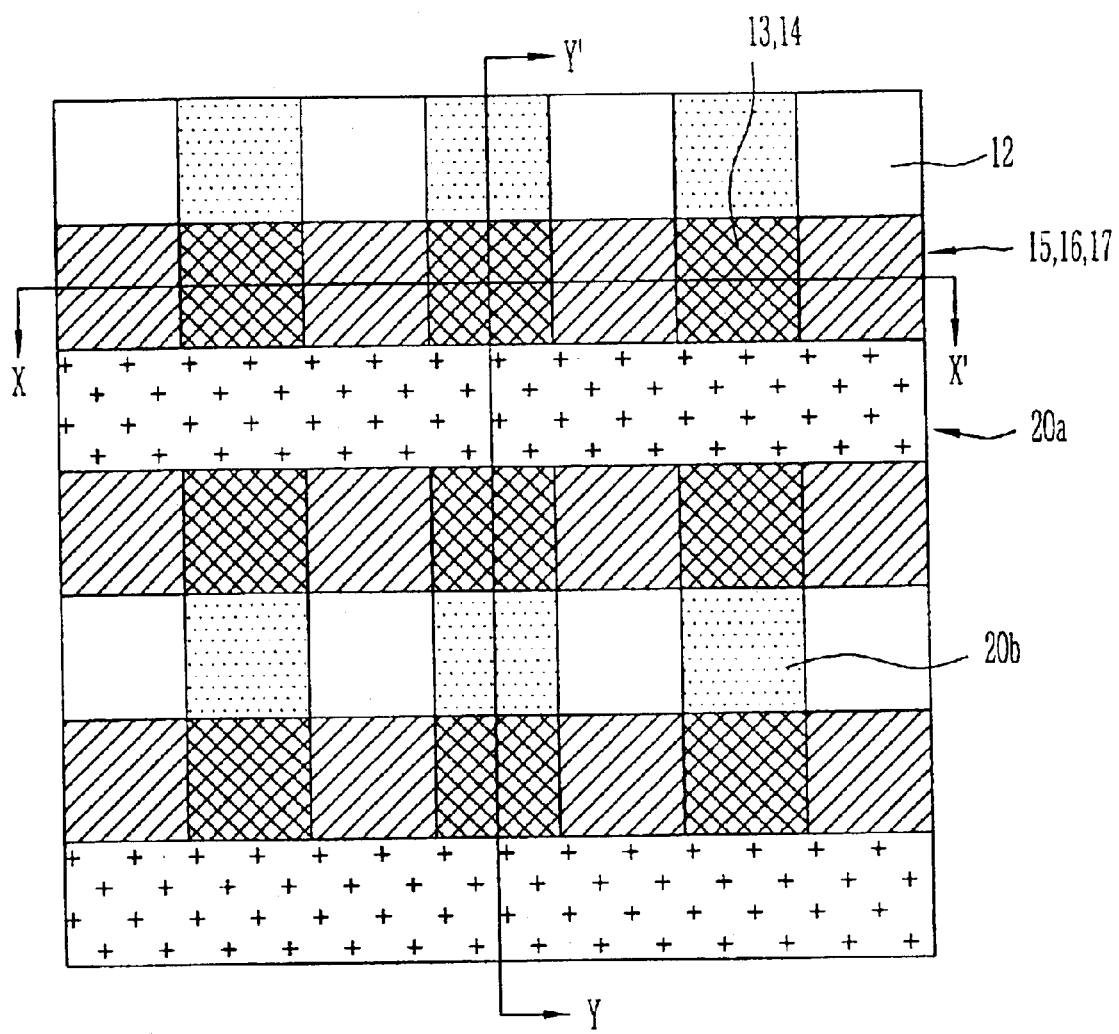
FIG. 1 is a layout diagram of a conventional flash memory cell.
Figure 2A:
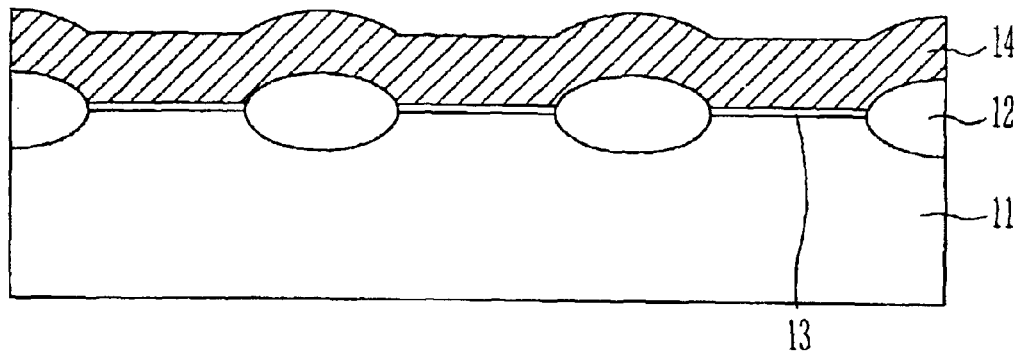
FIG. 2A through FIG. 2D are cross-sectional views of the flash memory cell for explaining a method of manufacturing the flash memory cell with the layout in FIG. 1 taken along lines X–X'.
Figure 2B:
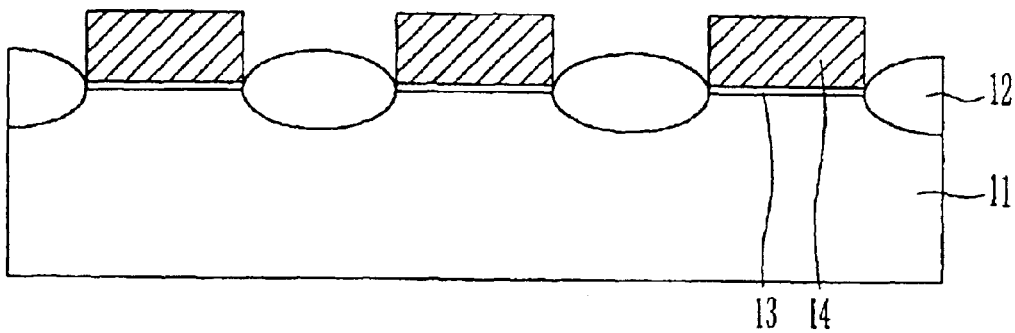
Figure 2C:
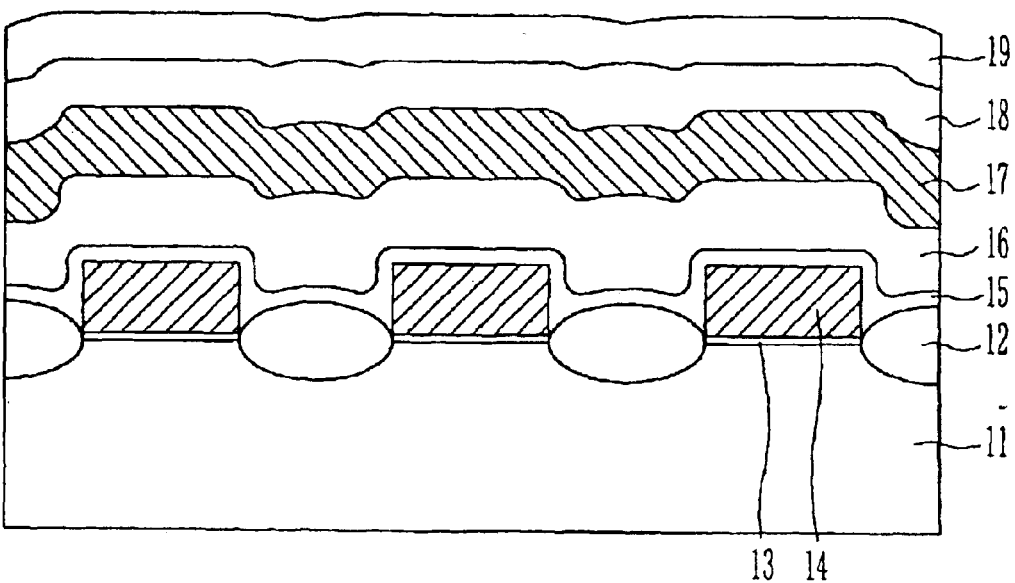
Figure 2D:
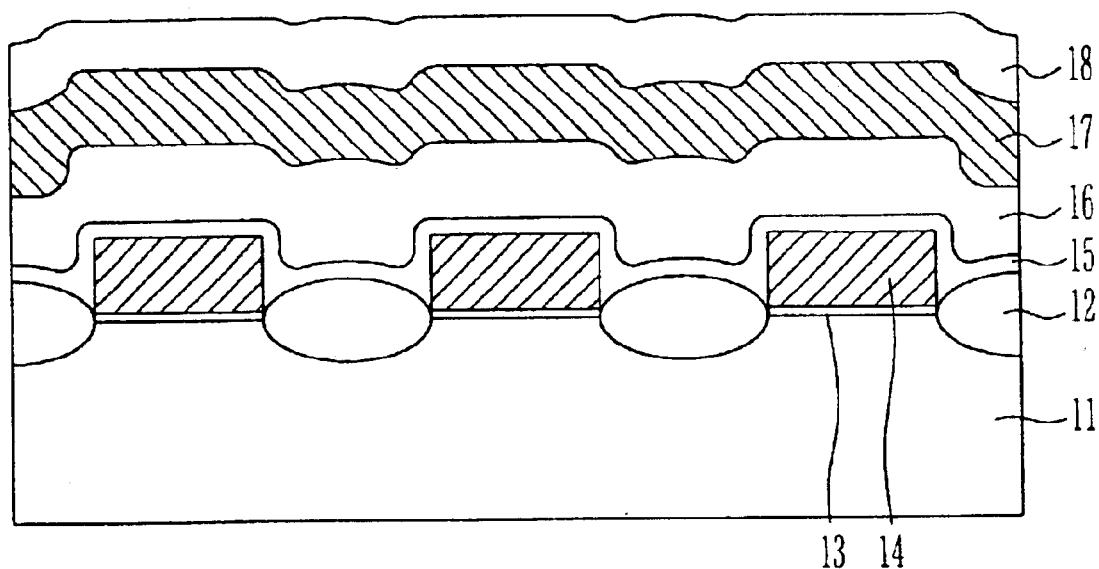
Figure 3A:
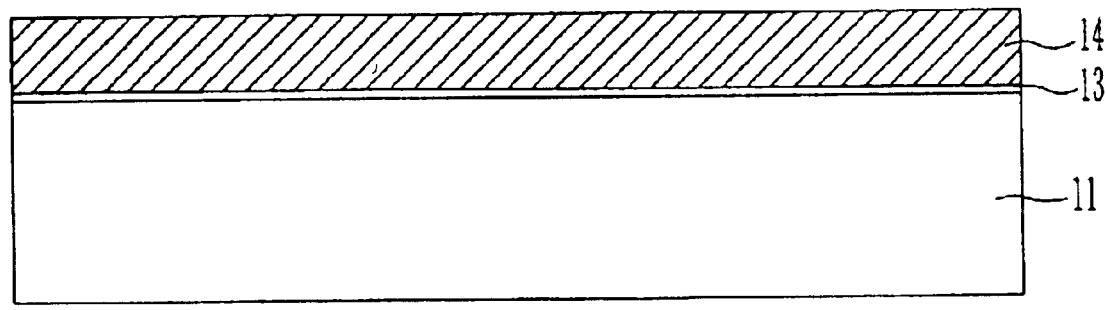
FIG. 3A through FIG. 3E are cross-sectional views of the flash memory cell for explaining a method of manufacturing the flash memory cell with the layout in FIG. 1 taken along lines Y–Y'.
Figure 3B:
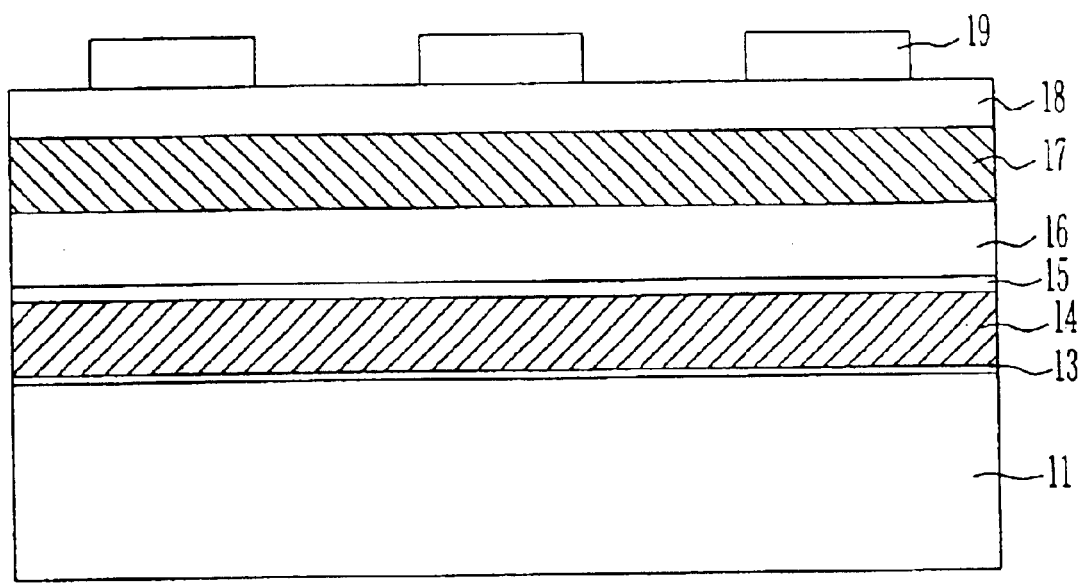
Figure 3C:
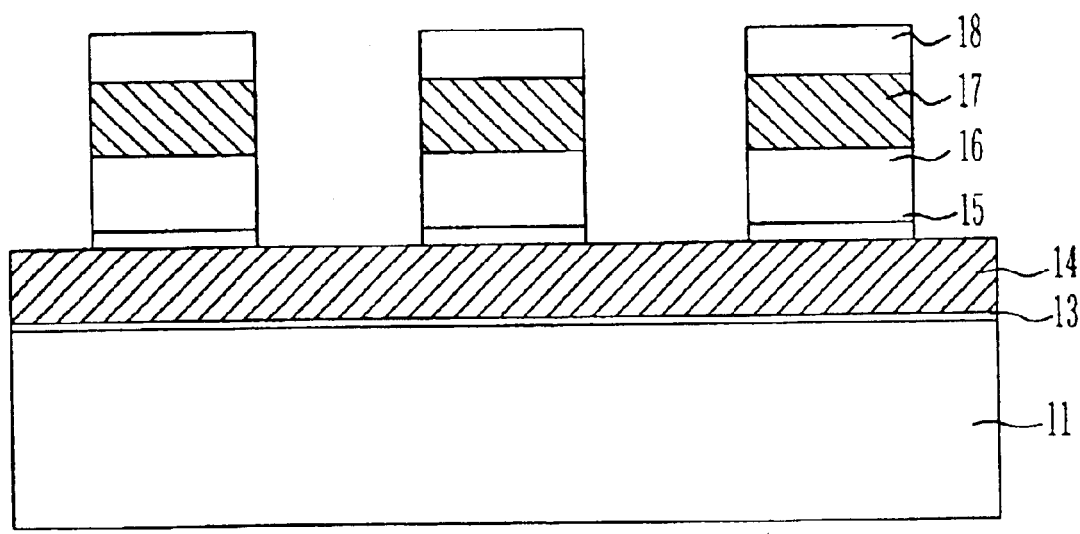
Figure 3D:
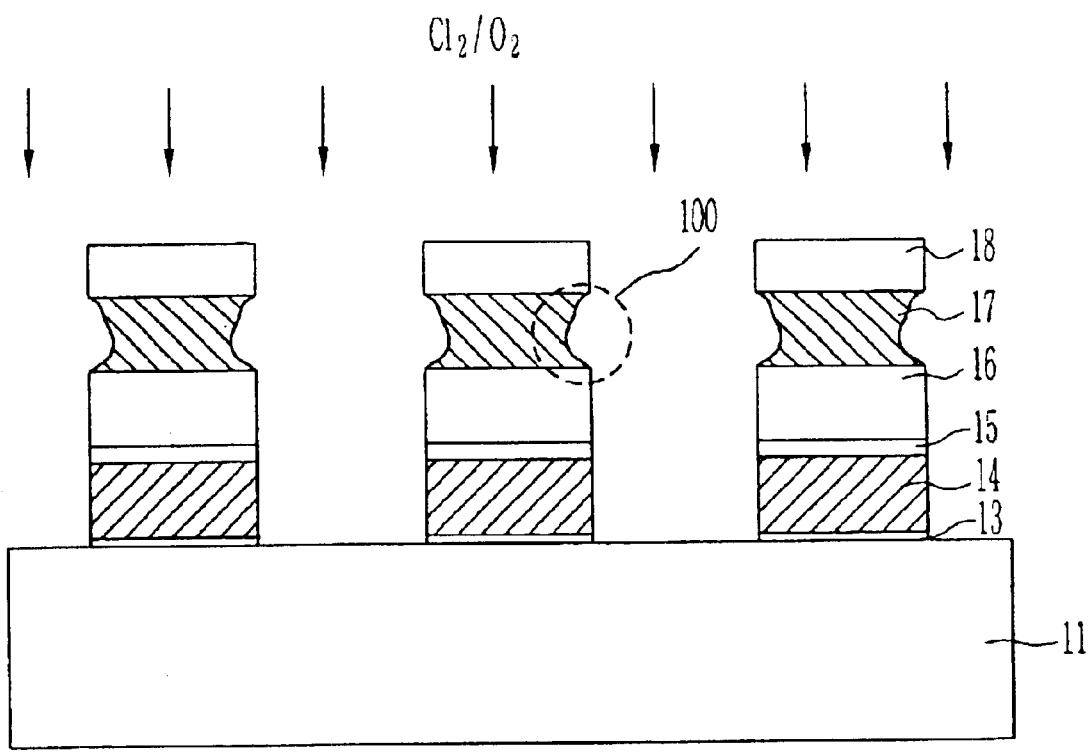
Figure 3E:
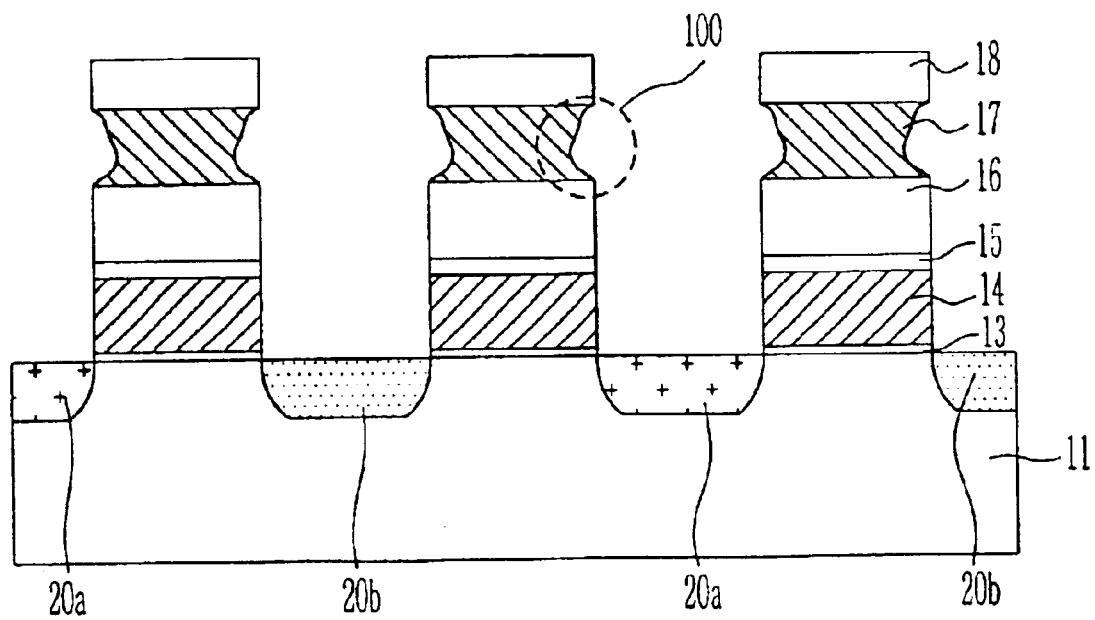
Figure 4A:
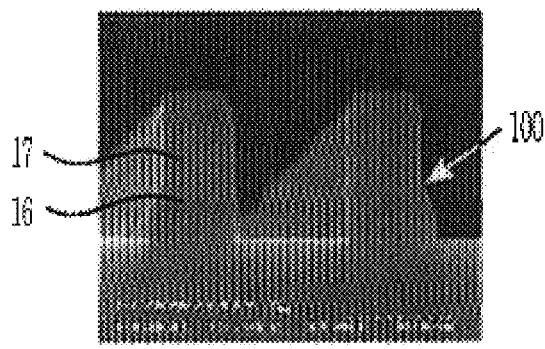
FIG. 4A and FIG. 4B show cross-sectional SEM photographs illustrating a state that etching damage is generated at the sidewall of a tungsten silicide layer.
Figure 4B:
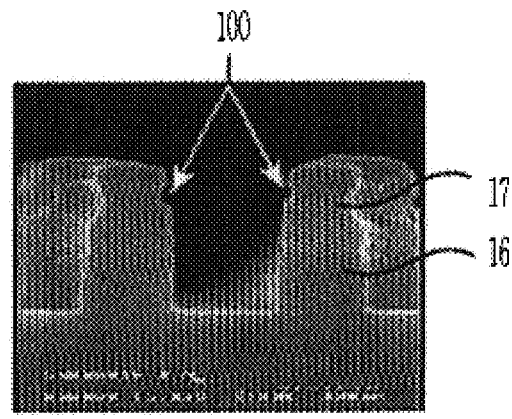
Figure 8A:
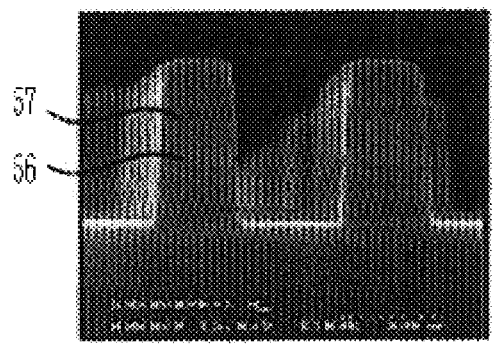
FIG. 8A and FIG. 8B show cross-sectional SEM photographs illustrating a state that etching damage is not generated at the sidewall of a tungsten silicide layer.

As described above, according to the present invention, a dry etching process is formed in order to form a control gate. A B cleaning process or a BN cleaning process is performed instead of the BOE cleaning process so that polymer can remain at the sidewall of the tungsten silicide layer. Therefore, the present invention has an advantage that the tungsten silicide layer can be prevented from an etching process upon a subsequent self-aligned etching process. In case that the BN cleaning process is used instead of the BOE cleaning process, the sidewall of the tungsten silicide layer is protected even though the self-aligned etching process is performed using a mixed gas of $Cl_2/O_2$ not a mixed gas of $HBr/O_2$, as shown in FIG. 8A. Therefore, a margin of the self-aligned etching process can be sufficiently obtained even with change in the cleaning process. In fact, the etch characteristic of the first polysilicon layer that is measured after the self-aligned etching process has a constant characteristic value regardless of the type of the cleaning process. Meanwhile, even after the BOE cleaning process is performed after the self-aligned etching process, a result of defect review through measuring equipment is almost is same.

Figure 8B:
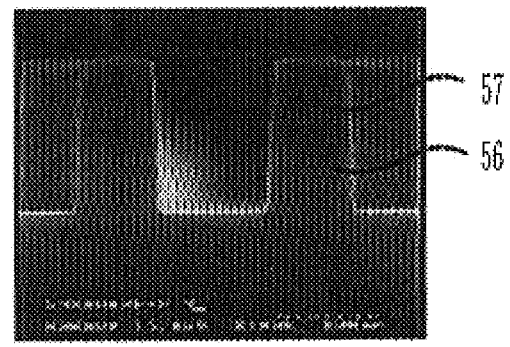

Also, the mixed gas of $HBr/O_2$ is used instead of the mixed gas of $Cl_2/O_2$ upon the self-aligned etching process regardless of existence of polymer at the sidewall of the tungsten silicide layer, so that the etch selective ratio of he polysilicon layer to the tungsten silicide layer is sufficiently obtained. Therefore, etching of the sidewall of the tungsten silicide layer can be prevented though polymer is not formed in the tungsten silicide layer, as shown in FIG. 8B.

As above, according to the present invention, an etch profile characteristic of the tungsten silicide layer can be improved by controlling a process condition of the cleaning process or a process condition of the self-aligned etching process. Further, the etch profile characteristic of the tungsten silicide layer can be further improved by controlling both the process conditions.

As mentioned above, the present invention has advantages that it can prevent etching of the sidewall of a tungsten silicide layer and improve an etch profile characteristic, by controlling a process condition of a cleaning process performed after an etching process of the control gate and a process condition of a self-aligned etching process. Therefore, an increase of the sheet resistance in the control gate can be prevented.

Further, as the etch profile characteristic of the tungsten silicide layer is improved, generation of damage to underlying second polysilicon layer and dielectric film is basically precluded. Therefore, the present invention has an advantage that an electrical characteristic such as a leakage current characteristic of a dielectric film, etc. can be improved and the yield can be increased.

The disclosed methods have been described with reference to particular embodiments in connection with particular applications. Those having ordinary skill in the art and access to the teachings of this disclosure will recognize additional modifications and applications within the scope thereof.

It is therefore intended by the appended claims to cover any and all such applications, modifications, and embodiments that fall within the spirit and scope of this disclosure.

What is claimed is:

1. A method of manufacturing a flash memory cell comprising:
   forming a tunnel oxide film and a first polysilicon layer with a given pattern;
   sequentially forming a dielectric film, a second polysilicon layer, a tungsten silicide layer and an anti-reflection film on the given pattern;
   forming a control gate consisting of the tungsten silicide layer and the second polysilicon layer by means of a patterning process; and
   forming a floating gate consisting of the first polysilicon layer by a self-aligned etching process,
   wherein, after the patterning process and before the self-aligned etching process, a cleaning process is carried out to remove oxide series particles but which leaves a polymer film at the side wall of the anti-reflection film, the tungsten silicide layer, the second polysilicon layer and the dielectric film, thereby protecting the side wall of the tungsten silicide layer from etching damage upon the self-aligned etching process.

2. The method as claimed in claim 1, wherein the patterning process is performed in either an etch equipment of a RIE type or an etch equipment of a MERIE type.

3. The method as claimed in claim 1, wherein the cleaning process includes performing either a B cleaning process or a BN cleaning process in which is simultaneously performed with the B cleaning and a N cleaning, in a cleaning equipment of a multi-bath type.

4. The method as claimed in claim 3, wherein the B cleaning process is performed using a solution in which $H_2SO_4$ and $H_2O_2$ are mixed at a ratio ranging from about 3:1 to about 4:1 at a temperature ranging from about 100 to about 130° C.

5. The method as claimed in claim 3, wherein the N cleaning process is performed using a solution in which $NH_4OH$, $H_2O_2$ and $H_2O$ are mixed at a ratio ranging from about 1:1:5 to about 1:4:20.

6. The method as claimed in claim 3, wherein the cleaning process is performed using a high frequency of about 10 MHz applied to a cleaning bath containing a cleaning solution, or using a rocking process by which the cleaning bath is shaken, in the cleaning equipment of a multi-bath type in order to improve a cleaning characteristic.

7. The method as claimed in claim 3, wherein the cleaning process uses a gain process by which a conductive FICD is increased by an amount ranging from about 15 to about 25% than a photoresist DICD.

8. The method as claimed in claim 1, wherein the self-aligned etching process is performed by applying a power bias ranging from about 100 to about 5000 W.

9. The method as claimed in claim 1, wherein the $HBr/O_2$ is mixed at a ratio ranging from about 50:1 to about 100:1.

10. The method as claimed in claim 1, wherein upon the self-aligned etching process, He gas at a flow rate ranging from about 50 to about 200 sccm is supplied as an additive gas.

11. A method of manufacturing a flash memory cell comprising:
preparing a semiconductor substrate in which a tunnel oxide film and a first polysilicon layer with a given pattern, and in which a dielectric film, a second polysilicon layer, a tungsten silicide layer and an anti-reflection film are sequentially formed on the given pattern;
patterning the anti-reflection film, the tungsten silicide layer, the second polysilicon layer and the dielectric film to form a control gate consisting of the tungsten silicide layer and the second polysilicon layer;
through a cleaning process, removing oxide series particles and while leaving a polymer film at the sidewall of the anti-reflection film, the tungsten silicide layer, the second polysilicon layer and the dielectric film;
etching the first polysilicon layer and the tunnel oxide film by means of a self-aligned etching process to form a floating gate consisting of the first polysilicon layer; and
forming source and drain at both sides of the tunnel oxide film.

12. The method as claimed in claim 11, wherein the patterning process is performed in either an etch equipment of a RIE type or an etch equipment of a MERIE type.

13. The method as claimed in claim 11, wherein the cleaning process includes performing either a B cleaning process or a BN cleaning process in which is simultaneously performed with the B cleaning and a N cleaning, in a cleaning equipment of a multi-bath type.

14. The method as claimed in claim 13, wherein the B cleaning process is performed using a solution in which $H_2SO_4$ and $H_2O_2$ are mixed at a ratio ranging from about 3:1 to about 4:1 at a temperature ranging from about 100 to about 130° C.

15. The method as claimed in claim 13, wherein the N cleaning process is performed using a solution in which $NH_4OH$, $H_2O_2$ and $H_2O$ are mixed at a ratio ranging from about 1:1:5 to about 1:4:20.

16. The method as claimed in claim 13, wherein the cleaning process is performed using a high frequency of about 10 MHz applied to a cleaning bath containing a cleaning solution, or using a rocking process by which the cleaning bath is shaken, in the cleaning equipment of a multi-bath type in order to improve a cleaning characteristic.

17. The method as claimed in claim 13, wherein the cleaning process uses a gain process by which a conductive FICD is increased by an amount ranging from about 15 to about 25% than a photoresist DICD.

18. The method as claimed in claims 11, wherein the self-aligned etching process is performed by applying a power bias ranging from about 100 to about 5000 W.

19. A method of manufacturing a flash memory cell, comprising the steps of:
preparing a semiconductor substrate in which a tunnel oxide film and a first polysilicon layer are formed with a given pattern, and in which a dielectric film, a second polysilicon layer, a tungsten silicide layer and an anti-reflection film are sequentially formed on the given pattern;
patterning the anti-reflection film, the tungsten silicide layer, the second polysilicon layer and the dielectric film to form a control gate consisting of the tungsten silicide layer and the second polysilicon layer;
removing oxide series particles through a cleaning process while leaving a polymer film at the sidewall of the anti-reflection film, the tungsten silicide layer, the second polysilicon layer and the dielectric film;
etching the first polysilicon layer and the tunnel oxide film by means of a self-aligned etching process using a mixed gas of $HBr/O_2$ to form a floating gate consisting of the first polysilicon layer; and
forming source and drain at both sides of the tunnel oxide film.

20. The method as claimed in claim 19, wherein the patterning process is performed in either an etch equipment of a RIE type or an etch equipment of a MERIE type.

21. The method as claimed in claim 19, wherein the cleaning process includes performing either a B cleaning process or a BN cleaning process in which is simultaneously performed with the B cleaning and a N cleaning, in a cleaning equipment of a multi-bath type.

22. The method as claimed in claim 21, wherein the B cleaning process is performed using a solution in which $H_2SO_4$ and $H_2O_2$ are mixed at a ratio ranging from about 3:1 to about 4:1 at a temperature ranging from about 100 to about 130° C.

23. The method as claimed in claim 21, wherein the N cleaning process is performed using a solution in which $NH_4OH$, $H_2O_2$ and $H_2O$ are mixed at a ratio ranging from about 1:1:5 to about 1:4:20.

24. The method as claimed in claim 21, wherein the cleaning process is performed using a high frequency of about 10 MHz applied to a cleaning bath containing a cleaning solution, or using a rocking process by which the cleaning bath is shaken, in the cleaning equipment of a multi-bath type in order to improve a cleaning characteristic.

25. The method as claimed in claim 21, wherein the cleaning process uses a gain process by which a conductive FICD is increased by an amount ranging from about 15 to about 25% than a photoresist DICD.

26. The method as claimed in claim 19, wherein the self-aligned etching process is performed by applying a power bias ranging from about 100 to about 5000 W.

27. The method as claimed in claim 19, wherein the $HBr/O_2$ is mixed at a ratio ranging from about 50:1 to about 100:1.

28. The method as claimed in claim 19, wherein upon the self-aligned etching process, He gas at a flow rate ranging from about 50 to about 200 sccm is supplied as an additive gas.

* * * * *